(12) United States Patent
Yu

(10) Patent No.: US 6,975,157 B1
(45) Date of Patent: *Dec. 13, 2005

(54) STARTER DEVICE FOR NORMALLY OFF JFETS

(75) Inventor: Ho-Yuan Yu, Saratago, CA (US)

(73) Assignee: Lovoltech, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/609,253

(22) Filed: Jun. 26, 2003

Related U.S. Application Data

(63) Continuation of application No. 09/708,336, filed on Nov. 7, 2000, now Pat. No. 6,614,289.

(51) Int. Cl.[7] .............................................. H03K 17/04
(52) U.S. Cl. ...................... 327/374; 327/375; 327/376; 327/377
(58) Field of Search ................................ 327/374, 377, 327/433, 435, 478; 326/17, 18

(56) References Cited

U.S. PATENT DOCUMENTS

| | | | | |
|---|---|---|---|---|
| 4,672,245 | A | * | 6/1987 | Majumdar et al. .......... 327/375 |
| 5,191,239 | A | * | 3/1993 | Rogers ........................ 326/110 |
| 6,349,047 | B1 | * | 2/2002 | Yu ............................... 363/127 |
| 6,614,289 | B1 | * | 9/2003 | Yu ............................... 327/374 |

OTHER PUBLICATIONS

H. Ogiwara, M. Hayakawa, T. Nishimura and M. Nakaoka; "High-Frequency Induction Heating Inverter with Multi-Resonant Mode Using Newly Developed Normally-Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017-1023.

J. Baliga; "Highvoltage Junction-Gate Field Effect Transistor WTH Recessed Gates"; IEEE Transactions on Electron Devices; vol. ED-29; No. 10; Oct. 1982

(Continued)

*Primary Examiner*—Timothy P. Callahan
*Assistant Examiner*—An T. Luu
(74) *Attorney, Agent, or Firm*—Wagner, Murabito & Hao LLP

(57) ABSTRACT

A semiconductor switching device or amplifier combined in parallel with one or more active devices defined as starter devices. A starter device is used to reduce the terminal voltage of a switching device or amplifier to a dc level below about 0.4 volts which will then allow the switching device to easily change between the on or conducting state and the off or non-conducting state. Three different starter devices are utilized. The first being a Bipolar Junction Transistor (BJT), the second a Metal Oxide Silicon Field Effect Transistor (MOSFET), and the third consisting of three normally off JFETs connected serially. Generally, a single starter device is coupled across the terminals of a semiconductor switching device or amplifier, but it is possible and sometimes advantageous to couple two or more starter devices in parallel. In a first case, a symmetrical, normally off or enhancement mode JFET is used as the switch or amplifier. A starter device coupled between source and drain of the JFET will allow operation at dc voltage levels above 0.4 volts. In a second case, an asymmetrical, normally off JFET is used as the switch or amplifier. A starter device coupled between source and drain of the JFET will allow operation at dc voltage levels above 0.4 volts. In a third case, a normally off MESFET is used as the switch or amplifier. A starter device coupled between source and drain of the MESFET will allow operation at dc voltage levels above 0.4 volts.

20 Claims, 11 Drawing Sheets

OTHER PUBLICATIONS

J.M.C. Stork et al.; "Small Geometry Depleted Base Bipolar Transistors (BSIT)- VLSI Devises?"; IEEE Transactions on Electron Devices; vol. ED-28; No. 11; Nov. 1981.

Nishizawa et al.; "Analysis of Static Characteristics of a Bipolar Mode SIT (BSIT)"; IEEE Transactions on Electron Devices; vol. ED-29; No. 11; Aug. 1982.

Caruso et al.; "Performance Analysis of a Bipolar Mode FET (BMFET) with Normally Off Characteristics"; IEEE Transactions on Power Electronics; vol. 3; No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

100

200

STARTER DEVICE FOR NORMALLY OFF JFETS

CROSS-REFERENCE TO RELATED APPLICATIONS

This is a continuation of patent application Ser. No. 09/708,336, filed Nov. 7, 2000, now of U.S. Pat. No. 6,614,289 issued Sep. 2, 2003.

RELATED APPLICATIONS

The following copending U.S. patent application Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, filed 2 Dec., 1999, is incorporated herein by reference for all purposes. The following copending U.S. provisional patent application Ser. No. 60/167,959, "STARTER DEVICE FOR NORMALLY "OFF" JFETS", Ho-Yuan Yu, filed 29 Nov., 1999, is incorporated herein by reference for all purposes.

BACKGROUND OF THE INVENTION

1. Field of the Invention

The present invention relates generally to the field of active semiconductor devices. More specifically, the present invention relates to novel semiconductor device structures useful in low voltage and high current density applications. More particularly, the present invention relates to active semiconductor devices referred to as normally off Field Effect Transistors (FET), which specifically include Junction Field Effect Transistors (JFET) as well as Metal Semiconductor Field Effect Transistors (MESFET).

2. Related Art

The increasing trend toward lower supply voltages for active semiconductor devices and Integrated Circuits (IC's) has accelerated the search for more efficient low voltage power sources. Conventional power supplies utilizing silicon diode rectifiers are unacceptable in low voltage applications due to the excessive voltage drop across the forward biased diode terminals. Power loss in the diodes becomes excessive when they are used as rectifiers in a direct current (dc) power supply designed for a terminal voltage as low as 3.0 volts.

Semiconductor diodes are combined with active devices to form circuits capable of producing low value dc supply voltages, but such circuits are generally not capable of handling the large currents frequently required. They usually exhibit a fairly large internal resistance and as such are very inefficient power sources. Furthermore, the number and complexity of steps required in the processing of this type of circuit as an IC also increases with the number of devices included.

Active semiconductor devices are used as switches in circuit arrangements producing dc power supply voltages, as for example in switched mode power supplies. Junction Field Effect Transistors (JFET) can be used as switches because they are easily switched between an on or conducting state and an off or non-conducting state. Most importantly, the current carriers in a JFET are all majority carriers which results in short switching times. However, when operated at lower voltages, JFETs exhibit an internal resistance in the on state that make them unsatisfactory and inefficient in applications requiring large currents.

In U.S. Pat. No. 4,523,111 entitled "Normally-Off Gate-Controlled Electric Circuit with Low On-Resistance", Baliga disclosed a JFET serially connected to an Insulated Gate Field Effect Transistor (IGFET). The on resistance of this circuit is the sum of the JFET resistance and the IGFET resistance. As a result, the on resistance is too large and therefore unsatisfactory for low voltage operations requiring large currents.

In a similar invention disclosed in U.S. Pat. No. 4,645,957 entitled "Normally Off Semiconductor Device with Low On-Resistance and Circuit Analogue" by Baliga, a JFET is serially connected to a Bipolar Junction Transistor (BJT). The on resistance is the sum of the JFET and the BJT which is again too large for low voltage applications requiring large currents.

The previously cited U.S. patent application Ser. No. 09/430,500, "NOVEL JFET STRUCTURE AND MANUFACTURING METHOD FOR LOW ON RESISTANCE AND LOW VOLTAGE APPLICATIONS", Ho-Yuan Yu, filed Dec. 2, 1999, discloses the basic structure for novel semiconductor devices useful for switching high level currents in ac circuit applications. These novel semiconductor devices have very low on resistance, and could be useful as switches in circuit arrangements producing dc power supply voltages, as for example in switched mode power supplies. Furthermore, the current carriers in these devices are all majority carriers which would result in short switching times. However, in dc circuit applications at voltage levels greater than approximately 0.4 volts, the normally off JFET disclosed will not easily switch between an on or conducting state and an off or non-conducting state. The normally off JFET wil not easily used as an amplifier under dc bias above 0.4 volts. Therefore a need of starter device to assist normally off JFET to be used as a switch or an amplifier under dc bias above 0.4 volt.

SUMMARY OF THE INVENTION

Accordingly, what is needed is a semiconductor circuit that can efficiently supply the dc currents required in both discrete and integrated circuits being operated at low dc supply voltages. What is also needed is a semiconductor switching device or an amplifier that has a very low on or current conducting resistance. What is needed yet is a semiconductor switching device or an amplifier that can be easily switched between an on or current conducting state and an off or non-current conducting state with the smallest possible switching time. What is further needed is a circuit or method that will allow the use of a normally off FET in dc circuit applications at dc voltage levels greater than approximately 0.4 volts. The present invention provides these advantages and others not specifically mentioned above but described in the sections to follow.

A semiconductor switching device or an amplifier combined in parallel with one or more active devices defined as a starter device. A starter device is used to reduce the terminal voltage of a switching device to a dc level below about 0.4 volts which will then allow the switching device to transition between the on or conducting state and the off or non-conducting state. The starter device also allows normally off JFET to be used as an amplifier under dc bias greater than 0.4 volt. Three different starter devices are utilized. The first being a Bipolar Junction Transistor (BJT), the second a Metal Oxide Silicon Field Effect Transistor (MOSFET), and the third consisting of three normally off JFETs connected serially. In general, a single starter device is coupled with the terminals of a semiconductor switching device, but it is possible and sometimes advantageous to couple two or more starter devices in parallel. In a first case, a symmetrical, normally off or enhancement mode JFET is used as the semiconductor switching device. One or more starter devices coupled between source and drain of the JFET will allow switching at dc voltage levels greater than 0.4 volts. In a second case, an asymmetrical, normally off JFET is used as the switching device. One or more starter devices coupled between source and drain of the JFET will allow switching at dc voltage levels greater than 0.4 volts. In a third case, a normally off MESFET is used as the switching device. One or more starter devices coupled between source and drain of the MESFET will allow switching at dc voltage levels greater than 0.4 volts.

More specifically, an embodiment of the present invention includes a symmetrical, enhancement mode JFET as the switching device or an amplifier device. In a first case, a BJT acting as the starter device is coupled between source and drain of the JFET. This BJT can be designed along with enhancement mode JFET or use the prasitic BJT of JFET as the starter device. In a second case, a normally off MOSFET acting as the starter device is coupled between source and drain of the JFET. In a third case, three normally off JFETs connected serially as a starter device are then coupled between source and drain of the JFET. Further cases include two or more starter devices coupled between source and drain of the JFET. Each of the resulting structures provide high current carrying capacity at low voltage levels, and will easily switch between states at dc voltage levels greater than 0.4 volts or used as an amplifier at dc voltage levels greater than 0.4 volt.

A second embodiment of the present invention includes an asymmetrical, enhancement mode JFET as the switching device or an amplifier device. In a first case, a BJT acting as the starter device, either by added structure or use its parasitic BJT structure, is coupled between source and drain of the JFET. In a second case, a normally off MOSFET acting as the starter device is coupled between source and drain of the JFET. In a third case, three normally off JFETs connected serially as a starter device are then coupled between source and drain of the JFET. Further cases include two or more starter devices coupled between source and drain of the JFET. Each of the resulting structures provide high current carrying capacity at low voltage levels, and will easily switch between states at dc voltage levels greater than 0.4 volts.

A third embodiment of the present invention includes a symmetrical, enhancement mode MESFET as the switching device or an amplifier device. In a first case, a BJT acting as the starter device by added structure is coupled between source and drain of the MESFET. In a second case, a normally off MOSFET acting as the starter device is coupled between source and drain of the MESFET. In a third case, three normally off JFETs connected serially as a starter device are then coupled between source and drain of the MESFET. Further cases include two or more starter devices coupled between source and drain of the MESFET. Each of the resulting structures provide high current carrying capacity at low voltage levels, and will easily switch between states at dc voltage levels greater than 0.4 volts.

DETAILED DESCRIPTION OF THE INVENTION

In the following detailed description of the present invention, starter device for normally off FETs, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1A:
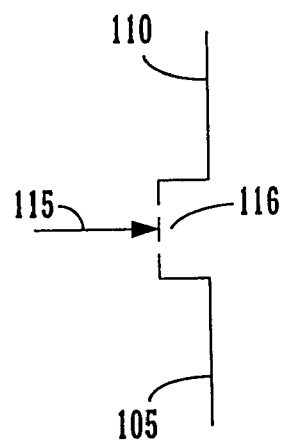
FIG. 1a shows the electronic symbol used in the present invention to represent an n-channel, symmetrical, normally off JFET.

FIG. 1 shows the electronic symbols used in the present invention to represent three different normally off FETs 100. FIG. 1a is the electronic symbol used to represent an n-channel, symmetrical, normally off JFET. The gate lead 115 is spaced equidistant between the source lead 105 and the drain lead 110 which identifies this as a symmetrical device. The direction of the arrow on the gate lead signifies an n-channel JFET. The broken line 116 between source and drain denotes a normally off or enhancement mode device. Since the device is symmetrical, the source and drain leads are interchangeable. A dc voltage that will forward bias both the p-n junction between gate and source and the p-n junction between gate and drain will switch the normally off JFET into the on state which will allow a dc current between source and drain. However, it is not possible to simultaneously forward bias both p-n junctions with the existence of a dc voltage between drain and source greater than approximately 0.4 volts. Therefore, switching the normally off JFET into a current conducting state with a dc drain to source voltage greater than about 0.4 volts requires the use of a starter device to initially forward bias both p-n junctions.

Figure 1B:
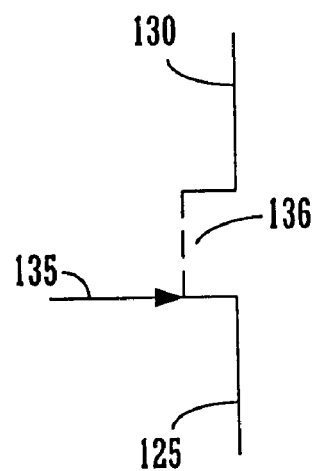
FIG. 1b shows the electronic symbol used in the present invention to represent an n-channel, asymmetrical, normally off JFET.

FIG. 1b is the electronic symbol used to represent an n-channel, asymmetrical, normally off JFET. The gate lead 135 is directly across from the source lead 125 which identifies this as an asymmetrical device. The direction of the arrow on the gate lead signifies an n-channel JFET. The broken line 136 between source and drain 130 denotes a normally off or enhancement mode device. A dc voltage that will forward bias both the p-n junction between gate and source and the p-n junction between gate and drain will switch the normally off JFET into the on state which will allow a dc current between source and drain. Again, it is not possible to simultaneously forward bias both p-n junctions with the existence of a dc voltage between drain and source greater than approximately 0.4 volts. Therefore, switching the normally off JFET into a current conducting state or use of the normally off JFET as an amplifier with a dc drain to source voltage greater than about 0.4 volts requires the use of a starter device to initially forward bias both p-n junctions.

Figure 1C:
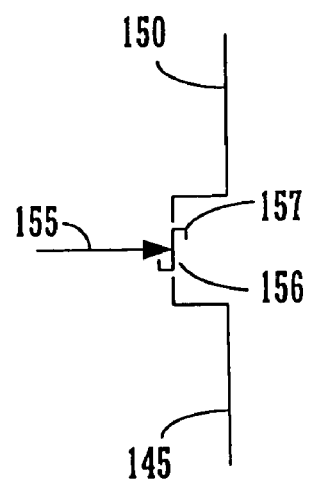
FIG. 1c shows the electronic symbol used in the present invention to represent an n-channel, symmetrical, normally off MESFET.

FIG. 1c is the electronic symbol used to represent an n-channel, symmetrical, normally off MESFET. The gate lead 155 is spaced equidistant between the source lead 145 and the drain lead 150 which identifies this as a symmetrical device. The direction of the arrow on the gate lead signifies an n-channel JFET. The broken line 156 between source and drain denotes a normally off or enhancement mode device. The angular center section 157 of the broken line denotes a Schottky diode as the gate structure. A do voltage that will forward bias both the Schottky barrier between gate and source and the Schottky barrier between gate and drain will switch the normally off MESFET into the on state which will allow a do current between source and drain. With this device, it is not possible to simultaneously forward bias both Schottky barriers with the existence of a dc voltage between drain and source greater than approximately 0.4 volts. Therefore, switching the MESFET into a current conducting state with a dc drain to source voltage greater than about 0.4 volts or use of MESFET as an amplifier requires the use of a starter device to initially forward bias both Schottky barriers.

FIG. 2 shows the electronic symbols used in the present invention to represent starter devices 200. FIG. 2a is a generic three terminal symbol that is used in the present invention to represent one or more devices coupled to form a starter device. Terminals 210 and 212 are coupled between the source and drain of an FET switching device, and a control signal is applied to terminal 211 to switch the starter device between conducting and non-conducting states.

Figure 2A:
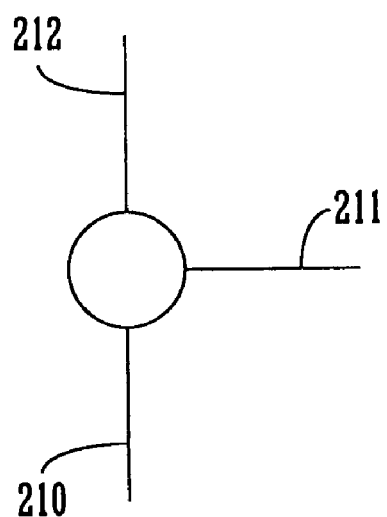
FIG. 2a shows the electronic symbol used in the present invention to represent a starter device.
Figure 2B:
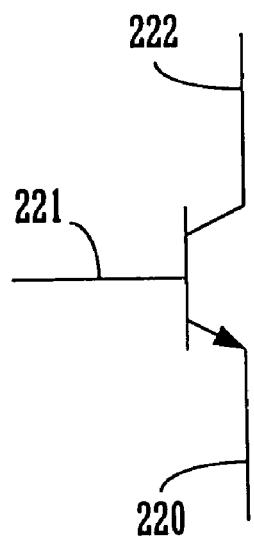
FIG. 2b shows the electronic symbol used in prior art to represent a BJT.

FIG. 2b is the prior art symbol used to represent an npn BJT. The emitter lead 220 corresponds to terminal 210 of the generic symbol, the base lead 221 corresponds to terminal 211 of the generic symbol and the collector lead 222 corresponds to terminal 212 of the generic symbol. This kind of BJT can be designed in with normally off JFET, using parasitic npn structure of JFET or simply connecting a discrete BJT to a JFET.

Figure 2C:
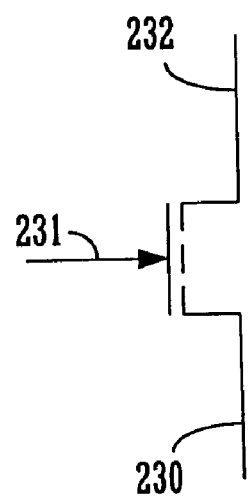
FIG. 2c shows the electronic symbol used in prior art to represent a normally off MOSFET.

FIG. 2c is the prior art symbol used to represent an n-channel MOSFET. The source lead 230 corresponds to terminal 210 of the generic symbol, the gate lead 231 corresponds to terminal 211 of the generic symbol and the drain lead 232 corresponds to terminal 212 of the generic symbol.

Figure 2D:
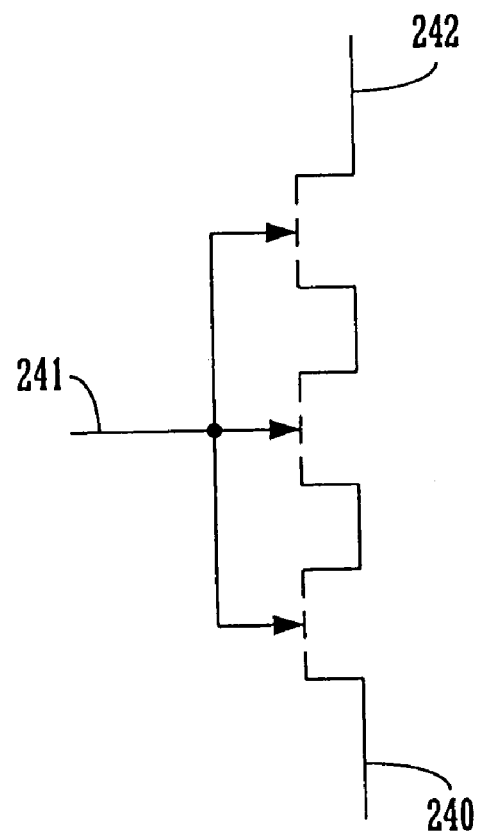
FIG. 2d shows the electronic symbol used in the present invention to represent three, n-channel, symmetrical, normally off JFETs connected in series to form a starter device.

FIG. 2d is the symbol used in the present invention to represent three n-channel JFETs coupled in series and having the three gate leads connected together. Lead 240 corresponds to terminal 210 of the generic symbol, lead 241 corresponds to terminal 211 of the generic symbol and lead 242 corresponds to terminal 212 of the generic symbol.

Figure 3:
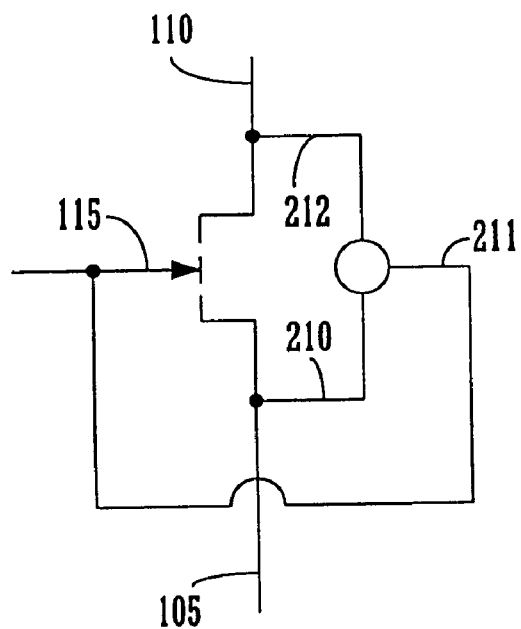
FIG. 3 shows the electronic symbol used in the present invention to represent an n-channel, symmetrical, normally off JFET coupled to a starter device.

FIG. 3 shows the electronic symbol used 300 in the present invention to represent an n-channel, symmetrical, normally off JFET coupled to a starter device. Lead 210 of the starter device is connected to the source lead 105 of the JFET, lead 212 of the starter device is connected to the drain lead 110 of the JFET and lead 211 of the starter device is connected to the gate lead 115 of the JFET. In dc circuit applications where the dc voltage between source and drain is greater than about 0.4 volts, a starter device which will initially forward bias both the p-n junction between gate and source and the p-n junction between gate and drain is required to switch the normally off JFET into the current conducting state or us the normally off JFET as an amplifier under dc bias above 0.4 volts.

In a first case, the starter device is an npn BJT coupled to the JFET with emitter 210 connnected to source 105, base 211 connected to gate 115 and collector 212 connected to drain 110. A dc voltage applied which will forward bias the gate-source p-n junction will also forward bias the base-emitter junction of the BJT. The BJT will thus switch into a current conducting state and the voltage collector to emitter will reduce to around 0.4 volts dc. The source to drain voltage of the JFET is simultaneously reduced to around 0.1 volts dc which forward biases both p-n junctions of the JFET. The JFET is thus switched on or used as an amplifier and will then conduct current between source and drain. A dc voltage applied which will forward bias the gate-drain p-n junction will also forward bias the base-collector junction of the BJT. The BJT will thus switch in the inverse mode into a current conducting state and the voltage collector to emitter will reduce to around 0.1 volts dc. The source to drain voltage of the JFET is again reduced to around 0.1 volts dc which forward biases both p-n junctions of the JFET. The JFET is thus switched on or used as an amplifier and will then conduct current between source and drain. This BJT can be individually designed along with JFET or use the parasitic npn structure of JFET as the starter device.

In a second case, the starter device is an n-channel, normally off MOSFET coupled to the JFET with source 210 connected to source 105, drain 212 connected to drain 110 and gate 211 connected to gate 115. A dc voltage applied to the gate of the JFET that will forward bias either the JFET gate to source p-n junction or the JFET gate to drain p-n junction will switch the normally off MOSFET into a current conducting state which will reduce the drain to source voltage of both FETs to around 0.1 volts or less. Thus both p-n junctions of the JFET will be forward biased and the JFET will switch on and will then conduct current between source and drain.

In a third case, the starter device consists of three normally off, symmetrical, n-channel JFETs connected in series and having their gate leads connected together to form a three terminal device as illustrated in FIG. 2d. The starter device is coupled to the JFET with source 210 connected to source 105, drain 212 connected to drain 110 and gate 211 connected to gate 115. A dc voltage applied to the gate of the JFET that will forward bias either the JFET gate to source p-n junction or the JFET gate to drain p-n junction will switch the normall off starter device into a current conducting state which will reduce the drain to source voltage of the JFET to around 0.1 volts or less. Thus both p-n junctions of the JFET will be forward biased and the JFET will switch on and will then conduct current between source and drain.

Figure 4:
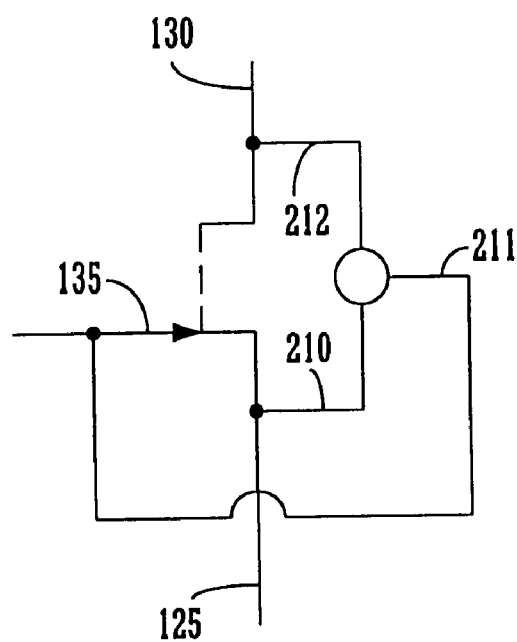
FIG. 4 shows the electronic symbol used in the present invention to represent an n-channel, asymmetrical, normally off JFET coupled to a starter device.

FIG. 4 shows the electronic symbol used 400 in the present invention to represent an n-channel, asymmetrical, normally off JFET coupled to a starter device. Lead 210 of the starter device is connected to the source lead 125 of the JFET, lead 212 of the starter device is connected to the drain lead 130 of the JFET and lead 211 of the starter device is connected to the gate lead 135 of the JFET. In dc circuit applications where the dc voltage between source and drain is greater than about 0.4 volts, a starter device which will initially forward bias both the p-n junction between gate and source and the p-n junction between gate and drain is required to switch the normally off JFET into the current conducting state.

In a first case, the starter device is an npn BJT coupled to the JFET with emitter 210 connnected to source 125, base 211 connected to gate 135 and collector 212 connected to drain 130. A dc voltage applied which will forward bias the gate-source p-n junction will also forward bias the base-emitter junction of the BJT. The BJT will thus switch into a current conducting state and the voltage collector to emitter will reduce to around 0.1 volts dc. The source to drain voltage of the JFET is simultaneously reduced to around 0.1 volts dc which forward biases both p-n junctions of the JFET. The JFET is thus switched on and will then conduct current between source and drain. A dc voltage applied which will forward bias the gate-drain p-n junction will also forward bias the base-collector junction of the BJT. The BJT will thus switch in the inverse mode into a current conducting state and the voltage collector to emitter will reduce to around 0.1 volts dc. The source to drain voltage of the JFET is again reduced to around 0.1 volts dc which forward biases both p-n junctions of the JFET. The JFET is thus switched on and will then conduct current between source and drain. This BJT can be individually designed along with JFET or use the parasitic npn structure of JFET as the starter device.

In a second case, the starter device is an n-channel, normally off MOSFET coupled to the JFET with source 210 connected to source 125, drain 212 connected to drain 130 and gate 211 connected to gate 135. A dc voltage applied to the gate of the JFET that will forward bias either the JFET gate to source p-n junction or the JFET gate to drain p-n junction will switch the normally off MOSFET into a current conducting state which will reduce the drain to source voltage of both FETs to around 0.1 volts or less. Thus both p-n junctions of the JFET will be forward biased and the JFET will switch on and will then conduct current between source and drain.

In a third case, the starter device consists of three normally off, symmetrical, n-channel JFETs connected in series and having their gate leads connected together to form a three terminal device as illustrated in FIG. 2d. The starter device is coupled to the JFET with source 210 connected to source 125, drain 212 connected to drain 130 and gate 211 connected to gate 135. A dc voltage applied to the gate of the JFET that will forward bias either the JFET gate to source p-n junction or the JFET gate to drain p-n junction will switch the normall off starter device into a current conducting state which will reduce the drain to source voltage of the JFET to around 0.1 volts or less. Thus both p-n junctions of the JFET will be forward biased and the JFET will switch on and will then conduct current between source and drain.

Figure 5:
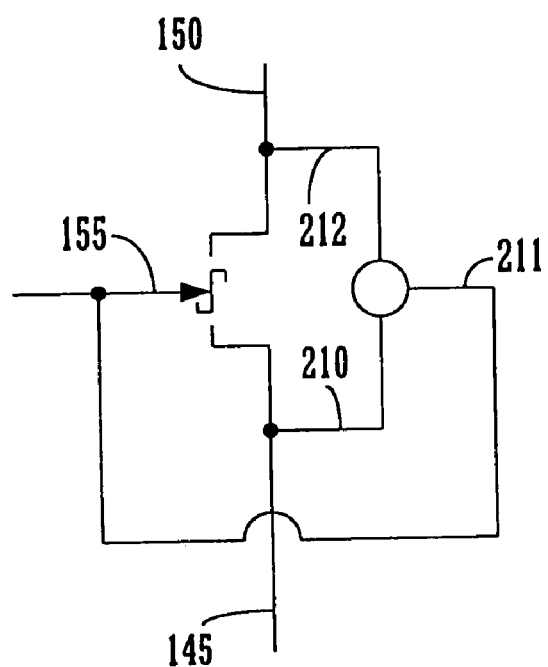
FIG. 5 shows the electronic symbol used in the present invention to represent an n-channel, symmetrical, normally off MESFET coupled to a starter device.

FIG. 5 shows the electronic symbol used 500 in the present invention to represent an n-channel, symmetrical, normally off MESFET coupled to a starter device. Lead 210 of the starter device is connected to the source lead 145 of the MESFET, lead 212 of the starter device is connected to the drain lead 150 of the MESFET and lead 211 of the starter device is connected to the gate lead 155 of the MESFET. In dc circuit applications where the dc voltage between source and drain is greater than about 0.4 volts, a starter device which will initially forward bias both the Schottky barrier between gate and source and the Schottky barrier between gate and drain is required to switch the normally off MESFET into the current conducting state.

In a first case, the starter device is an npn BJT coupled to the MESFET with emitter 210 connnected to source 145, base 211 connected to gate 155 and collector 212 connected to drain 150. A dc voltage applied which will forward bias the gate-source Schottky barrier will also forward bias the base-emitter junction of the BJT. The BJT will thus switch into a current conducting state and the voltage collector to emitter will reduce to around 0.1 volts dc. The source to drain voltage of the MESFET is simultaneously reduced to around 0.1 volts dc which forward biases both Schottky barriers of the MESFET. The MESFET is thus switched on and will then conduct current between source and drain. A dc voltage applied which will forward bias the gate-drain Schottky barrier will also forward bias the base-collector junction of the BJT. The BJT will thus switch in the inverse mode into a current conducting state and the voltage collector to emitter will reduce to around 0.1 volts dc. The source to drain voltage of the MESFET is again reduced to around 0.1 volts dc which forward biases both Schottky barriers of the MESFET. The MESFET is thus switched on and will then conduct current between source and drain.

In a second case, the starter device is an n-channel, normally off MOSFET coupled to the MESFET with source 210 connected to source 145, drain 212 connected to drain 150 and gate 211 connected to gate 155. A dc voltage applied to the gate of the MESFET that will forward bias either the MESFET gate to source p-n junction or the MESFET gate to drain p-n junction will switch the normally off MOSFET into a current conducting state which will reduce the drain to source voltage of both FETs to around 0.1 volts or less. Thus both Schottky barriers of the MESFET will be forward biased and the MESFET will switch on and will then conduct current between source and drain.

In a third case, the starter device consists of three normally off, symmetrical, n-channel JFETs connected in series and having their gate leads connected together to form a three terminal device as illustrated in FIG. 2d. The starter device is coupled to the MESFET with source 210 connected to source 145, drain 212 connected to drain 150 and gate 211 connected to gate 155. A dc voltage applied to the gate of the MESFET that will forward bias either the MESFET gate to source Schottky barrier or the MESFET gate to drain Schottky barrier will switch the normally off starter device into a current conducting state which will reduce the drain to source voltage of the MESFET to around 0.1 volts or less. Thus both Schottky barriers of the MESFET will be forward biased and the MESFET will switch on and will then conduct current between source and drain.

Figure 6:
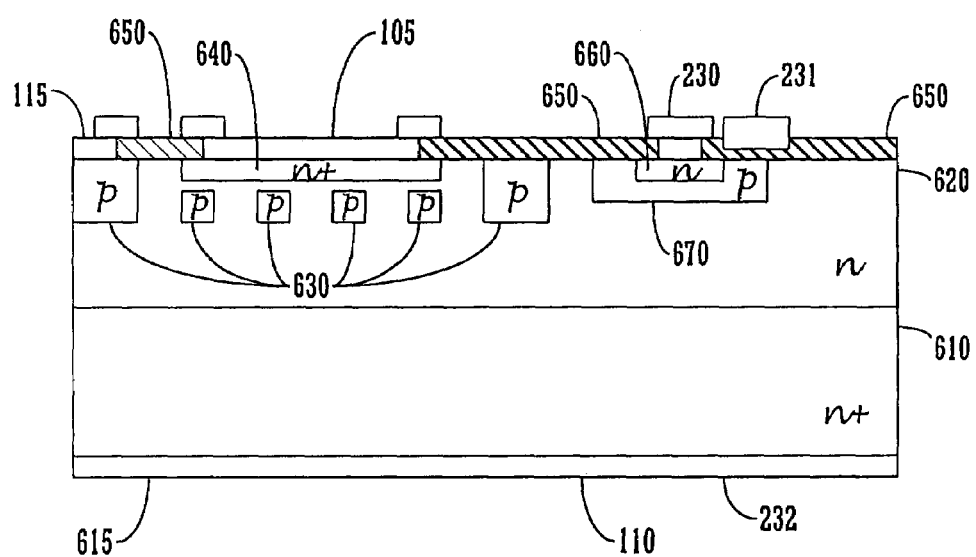
FIG. 6 is an exemplary cross-sectional view showing the construction of an n-channel, symmetrical, normally off JFET coupled to a normally off MOSFET starter device according to the present invention.

FIG. 6 is an exemplary cross-sectional view 600 showing the construction of an n-channel, symmetrical, normally off JFET coupled to a normally off MOSFET starter device according to the present invention. The substrate 610 serves as the structural base on which the FETs are formed. The n+ symbol in the substrate region shows an elevated n-type doping density necessary to form good ohmic contact with the metal electrode 615. This metal electrode serves as the contact for the drain lead of the JFET 110 as well as the drain lead of the MOSFET 232.

The epitaxial region adjacent to the substrate 620 is doped n-type with a doping density less than that of the substrate as signified by the letter n located within the epitaxial region. A region signified by the symbol n+ and having an elevated n-type doping density 640 is formed on the upper surface of the epitaxial layer in order to form good ohmic contact with the metal JFET source electrode 105.

Elements of the grill-like gate structure of the JFET 630 are exemplary rectangular areas doped p-type and distributed throughout the mid-section of the epitaxial region. Electrical contact to the JFET gate is by means of the metal region 115.

The n-type region on the upper surface of the epitaxial layer 660 serves as the source of the MOSFET, and the metal area 230 is the electrical contact for this region. The p-type region 670 surrounding the MOSFET source produces a depletion region between source and drain of the MOSFET, thereby creating a normally off device. The metal region 231 then acts as the gate lead for the MOSFET. The four metal electrodes on the upper surface are isolated electrically by oxide regions 650.

The metal area 615 acts as the single electrical contact connecting the JFET drain and the MOSFET drain. Electrical connections between JFET source and MOSFET source, and JFET gate and MOSFET gate are not shown here.

Likewise, this invention also applies to p-channel normally off JFET with pnp BJT or p-channel MOSFET. This invention also applies to other semiconductor materials such as germanium, gallium arsenide, heterojunction materials as sell as semiconductor on insulator (SOI) materials.

The preferred embodiment of the present invention, starter device for normally off FETs, is thus described. While the present invention has been described in particular embodiments, it should be appreciated that the present invention should not be construed as limited by such embodiments, but rather construed according to the below claims.

What is claimed is:

1. A current switch comprising:
   a first means for normally not conducting current and for maintaining conduction of a current in response to a first bias voltage; and
   a second means for starting conduction of said current in said first means in response to said first bias voltage.

2. The current switch according to claim 1, wherein said first means comprises a switching device having a first lead for receiving said first bias voltage, a second lead and a third lead, wherein said current is conducted between said second lead and said third lead when said maintaining conduction.

3. The current switch according to claim 2, wherein said second means comprises a starter device having a fourth lead for receiving said first bias voltage, a fifth lead coupled to said second lead of said switching device and a sixth lead coupled to said third lead of said switching device.

4. The current switch according to claim 3, wherein said current is conducted between said fifth lead and said sixth lead when said starting conduction.

5. A circuit comprising:
   a switching device normally in an off state; and
   a starter device for reducing a terminal voltage of said switching device.

6. The circuit of claim 5, wherein said starter device reduces said terminal voltage of said switching device below 0.4 volts.

7. The circuit of claim 6, wherein said reducing said terminal voltage allows said switching device to transition from said off state to said on state.

8. The circuit of claim 5, wherein said switching device is selected from the group consisting of a junction field effect transistor (JFET), a symmetrical junction field effect transistor, an asymmetrical junction field effect transistor, a metal-semiconductor field effect transistor (MESFET).

9. The circuit of claim 5, wherein said starter device is selected from the group consisting of a bipolar junction transistor (BJT), a plurality of bipolar junction transistors, a metal-oxide-semiconductor field effect transistor (MOSFET), a plurality of metal-oxide-semiconductor field effect transistors, a junction field effect transistor (JFET) and a plurality of junction field effect transistors.

10. The circuit of claim 5, wherein said switching device and said starter device are fabricated on a single substrate.

11. An amplifier comprising:
    a normally off active device; and
    a starter device coupled to said normally off active device for biasing said normally off active device to operate as an amplifier.

12. The amplifier of claim 11, wherein said normally off active device and said starter device are fabricated on a single substrate.

13. The circuit of claim 11, wherein said normally off active device is selected from the group consisting of a junction field effect transistor (JFET), a symmetrical junction field effect transistor, an asymmetrical junction field effect transistor, a metal-semiconductor field effect transistor (MESFET).

14. The amplifier of claim 13, wherein said starter device comprises a bipolar junction transistor (BJT).

15. The amplifier of claim 14, wherein said normally off active device operates as an amplifier when a base to emitter bias voltage of said bipolar junction transistor is approximately 0.4 or more.

16. The amplifier of claim 14, wherein said bipolar junction transistor is parasitic to said normally off active device.

17. The amplifier of claim 13, wherein said starter device comprises a metal-oxide-semiconductor field effect transistor (MOSFET).

18. The amplifier of claim 17, wherein said normally off active device operates as an amplifier when a gate to drain bias voltage of said metal-oxide-semiconductor field effect transistor is approximately 0.4 or more.

19. The amplifier of claim 13, wherein said starter device comprises a plurality of junction field effect transistors (JFET).

20. The amplifier of claim 19, wherein said normally off active device operates as an amplifier when a gate to drain bias voltage of said metal-oxide-semiconductor field effect transistor is approximately 0.4 or more.

* * * * *